United States Patent [19]

Cronin

[11] Patent Number: 5,663,101

[45] Date of Patent: Sep. 2, 1997

[54] SEMICONDUCTOR STRUCTURE HAVING MULTIPLE LEVELS OF SELF-ALIGNED INTERCONNECTION METALLIZATION, AND METHODS FOR ITS PREPARATION

[75] Inventor: John Edward Cronin, Milton, Vt.

[73] Assignee: International Business Machines Corporation, Armonk, N.Y.

[21] Appl. No.: 597,747

[22] Filed: Feb. 7, 1996

Related U.S. Application Data

[62] Division of Ser. No. 524,558, Sep. 7, 1995, Pat. No. 5,539,255.

[51] Int. Cl.$^6$ ............................................. H01L 21/44
[52] U.S. Cl. ..................................... 438/637; 438/672
[58] Field of Search .............................. 437/195, 203, 437/228, 245; 156/626.1, 656.1

[56] References Cited

U.S. PATENT DOCUMENTS

| | | | |
|---|---|---|---|
| 4,536,951 | 8/1985 | Rhodes et al. | 29/589 |
| 4,789,648 | 12/1988 | Chow et al. | 437/225 |
| 4,832,789 | 5/1989 | Cochran et al. | 156/644.1 |
| 4,962,058 | 10/1990 | Cronin et al. | 437/187 |
| 4,996,133 | 2/1991 | Brighton et al. | |
| 5,002,902 | 3/1991 | Watanabe | 437/235 |
| 5,036,382 | 7/1991 | Yamaha | 357/71 |
| 5,091,339 | 2/1992 | Carey | 437/187 |
| 5,122,859 | 6/1992 | Coleman, Jr. | 357/71 |
| 5,136,124 | 8/1992 | Cronin et al. | 174/261 |
| 5,173,442 | 12/1992 | Carey | 437/173 |
| 5,189,506 | 2/1993 | Cronin et al. | 257/752 |
| 5,258,328 | 11/1993 | Sunada et al. | 437/195 |
| 5,330,617 | 7/1994 | Haond | 156/646.1 |
| 5,539,255 | 7/1996 | Cronin | 257/750 |

FOREIGN PATENT DOCUMENTS

| | | |
|---|---|---|
| 425787 | 5/1991 | European Pat. Off. . |
| 4324638 | 2/1994 | Germany . |

OTHER PUBLICATIONS

IBM Technical Disclosure Bulletin vol. 31 No. 4 Sep. 1988 pp. 400–401.

Primary Examiner—John Niebling
Assistant Examiner—C. Everhart
Attorney, Agent, or Firm—Heslin & Rothenberg, P.C.

[57] ABSTRACT

An improved semiconductor structure is disclosed, including at least one stud-up and an interconnection line connected thereto, wherein the stud-up and interconnection line are formed from a single layer of metal. The structure is prepared by a method in which an insulator region is first provided on a semiconductor substrate, and is then patterned and etched to define at least one opening having a preselected depth. Metal is deposited to fill the opening and form the interconnection line, followed by the patterning and formation of a stud-up of desired dimensions within the metal-filled opening. The lower end of the stud-up becomes connected to the interconnection line, and the upper end of the stud-up terminates at or near the upper surface of the insulator region. Other embodiments also include an interconnected stud-down.

An endpoint detection technique can be used to precisely control the height of the stud-up and the width of the interconnection line.

15 Claims, 1 Drawing Sheet

SEMICONDUCTOR STRUCTURE HAVING MULTIPLE LEVELS OF SELF-ALIGNED INTERCONNECTION METALLIZATION, AND METHODS FOR ITS PREPARATION

This application is a division of application Ser. No. 08/524,558 filed Sep. 7, 1995 which application is now U.S. Pat. No. 5,539,255.

TECHNICAL FIELD

The present invention relates generally to integrated circuit fabrication, and more particularly, to semiconductor structures having multiple levels of self-aligned, interconnection metallization. The invention also relates to improved methods for making these types of devices.

BACKGROUND OF THE INVENTION

A semiconductor chip is made up of an array of devices whose contacts are connected by patterns of metallic wiring. In very large-scale integrated (VLSI) circuit chips, the metallic wiring patterns are multi-layered, and separated by layers of insulating material. Interconnection between the different levels of metal wiring patterns is made by holes (or "via" holes), which are etched through the insulator layers. Chip designs usually consist of one or two wiring levels, but the use of three wiring levels is becoming much more prominent.

Because of circuit economics and performance requirements, the addition of more wiring levels usually cannot be accompanied by higher costs, even though additional processing steps are involved. As an example, many semiconductor processes require 15 or more mask levels to complete metallization. Thus, greater efficiency must be achieved in this area of interconnection, i.e., the Back End of the Line (BEOL), so that much higher VLSI densities can be achieved economically, without detracting from the overall performance of the chip.

The density of a particular device is often characterized in terms of its "pitch", which is defined as the area encompassing a via and the space next to a via extending to the next via. A "lower" or "minimum" pitch indicates a much tighter arrangement of vias and adjacent spaces, and is desirable because it permits a much higher density of features in the device. However, minimum pitch also makes the task of precise wiring and interconnection more difficult.

One technique that has been utilized for metallization in and between vias is often referred to as "lift-off". In this technique, a via is first tapered by etching, followed by the application of a photoresist, which is exposed in the area intended for metal deposition. After the photoresist is developed in desired areas, a metal like aluminum is evaporated into the vias. Lifting off the resist removes the overlying metal, thereby forming the desired stenciled pattern. The process can be repeated between successively deposited insulation layers when multiple levels of metallization for wiring patterns is desired.

While the lift-off technique was suitable for the metallization of many devices, its value was limited to some degree in higher density situations. Lift-off requires line-of-sight deposition and patterning of metal, i.e., in the evaporation process. For a device having a pitch of less than about 2.5 microns, line-of-sight deposition is often not practical, since the deposition source has to be too far away from the wafer, i.e., from the photoresist surface. Furthermore, the lift-off technique can result in an undesirable, rounded feature profile. The technique is also usually limited to temperatures below 200° C.–300° C., the point at which most photoresist materials begin to degrade.

An alternative to the lift-off technique is known as reactive ion etching (RIE). In this technique, a blanket layer of metal is applied over the contoured vias, followed by the application of a photoresist on top of the metal. The exposed and developed photoresist is then used as a mask, permitting the metal to be subtractively etched. Once the photoresist is stripped, the desired pattern is achieved. RIE allows for a tighter pitch, more directional sidewalls, and a desirable feature profile.

However, there are some disadvantages associated with the RIE-based technique, especially when a pitch as low as 2 to 3 microns is desired. In the case of aluminum metallization, alloying with copper is usually necessary to ensure electromigration resistance. However, aluminum-copper alloys are often difficult to etch using the RIE technique. Residual metal often remains, and is corroded by the etching solutions. This type of corrosion often leads to subsequent electrical shorting in the semiconductor chip.

A process developed to overcome some of the drawbacks of the lift-off and RIE-based techniques is sometimes referred to as the "damascene" process. An embodiment of this technology is described in U.S. Pat. No. 4,789,648 of M. Chow et al. The process relies in part on the use of overlapping masks to define vias and interconnection lines. In one embodiment, an insulation layer is applied over a layer of patterned conductive material, followed by the deposition of an etch stop material. Contact holes are photolithographically defined in the etch stop material. A second planarized insulation layer is then deposited, patterned, and etched down to the etch stop material to define desired wiring channels which will be in alignment with previously-formed contact holes in the etch stop material. In the locations where the contact holes are exposed, etching is continued into the first layer of insulation to uncover the underlying first level of patterned conductive material. The channels and vias etched into the second and first layers of insulation, respectively, are then over-filled with metallization. The excess metallization on the surface is removed by a suitable technique, such as chemical-mechanical polishing. The steps can be repeated for additional layers of metallization.

The damascene process results in a structure with a very tightly controlled pitch, e.g., up to about 0.75 micron. Furthermore, the structure is highly planarized, and is thus resistant to some of the problems associated with non-planar structures, e.g., shorting due to thinning insulation between adjacent levels of metallization. Moreover, the fabrication process is simpler than that used previously, since patterned conductive lines are formed simultaneously with stud vias.

As the industry moves toward even denser semiconductor circuits, additional processing steps will be required, e.g., to make the pitch even tighter, or to construct higher levels of metallization and vias. These additional steps need to be streamlined to make the overall process as efficient as possible, in view of the competitive economic pressures discussed previously.

An example of an instance in which streamlined manufacturing has been successful is offered by the teaching of U.S. Pat. No. 4,962,058, issued to S. Cronin et al. The patent discloses an improved process for forming a multi-level metallization structure from a single layer of conductive material. The wiring structures described in Cronin et al. have external connections represented by stud-up and stud-down structures. The number of wire processing steps is decreased in that invention, as compared to prior art processes.

The Cronin et al. process involves the masking and etching of a planar insulating layer to form a plurality of wiring troughs in the upper portion of the insulating layer, and at least one stud-down via in a lower portion of the insulating layer, followed by the deposition of a layer of metal to fill the vias and the troughs, with excess metal residing on top of the structure. The metal surface is then masked and etched to define at least one stud-up, as well as a plurality of interconnection lines. (RIE is usually required, although such a technique in this particular instant may result in the presence of residual etch material and metal "stringers".) The masking/etching step is carried out in a manner which results in a desired level of stud-up structures being situated on top of the mask material and the layer of conductive material. Again, all of the stud-downs, stud-ups, and interconnection lines have been formed from the same layer of metal. The various stud-ups, e.g., as depicted in FIG. 4D of the patent, continue to reside above the surface of the top insulating layer. Additional processing steps may be employed to deposit additional insulating material so that these stud-ups are planarized to the surface of the overall structure.

It's clear from the foregoing, as well as from a survey of the state of the art, that many improvements have been made in the area of high density integrated circuits. However, even further improvement is necessary as the dimensions of these types of circuits become even smaller. Specifically, improved techniques are desirable for efficiently preparing semiconductor structures which include self-aligned stud-ups, stud-downs, and interconnection lines formed from a single layer of metal. The new techniques should streamline the fabrication process as much as possible, while still resulting in devices which have a very tight pitch. The devices should also be characterized by as small a number of defects as possible, e.g., minimal electrical shorts or "necking" effects. Moreover, the processes employed should allow for the formation of both thick and thin wiring structures, even in a multi-level structure, as well as allowing for the formation of studs of very precise dimensions.

SUMMARY OF THE INVENTION

In view of the needs described above, an improved semiconductor structure has been discovered. It includes at least one stud-up and an interconnection line connected thereto wherein the stud-up and interconnection line are formed from a single layer of metal. The structure is prepared by an inventive method comprising the following steps:

An improved method for preparing a semiconductor structure which includes at least one stud-up and at least one interconnection line connected to the stud-up, wherein the stud-up and the interconnection line are self-aligned, and are formed from a single layer of metal; said method comprising the following steps:

a) providing an insulator region on a semiconductor substrate;

b) patterning and etching the insulator region with a mask to define at least one opening having a pre-selected depth;

c) depositing metal to fill the opening, thereby forming the interconnection line; and d) patterning and then forming a stud-up of desired dimensions within the metal-filled opening, the lower end of said stud-up being connected to the interconnection line, and the upper end of said stud-up terminating at or near the upper surface of the insulator region.

Other embodiments of the invention include at least one stud-down, also formed from the single layer of metal. A method to form the stud-down in conjunction with the interconnection line and the stud-up is also provided below.

In another optional embodiment, an endpoint detection technique is used to precisely control the height of the stud-up and the width of the interconnection line.

DETAILED DESCRIPTION OF THE INVENTION

Figure 1:
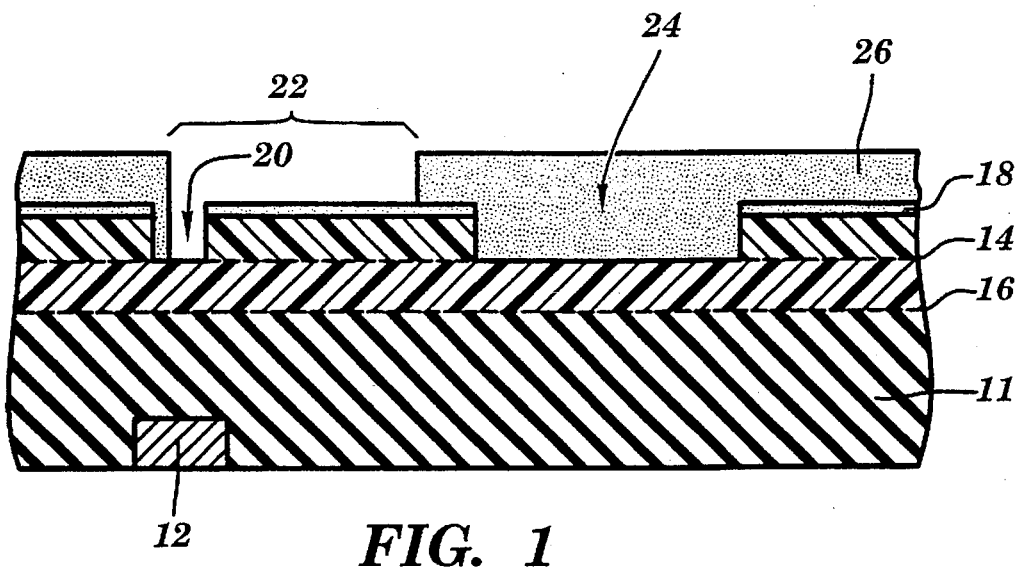
FIG. 1 is a simplified, cross-sectional view of a semiconductor structure undergoing masking and etching steps for contact and line openings, and for the formation of an endpoint detection region.

The first embodiment presented will be one which involves the formation of a stud-up, an interconnection line, and a stud-down. FIG. 1 is a cross-sectional view of the initial stages of formation of a semiconductor structure in accordance with the present invention. The structure is usually designed for use as a conventional transistor, e.g., an n-FET or p-FET (field effect transistor). Insulating layer or region 11 is typically deposited on a silicon substrate (not shown) of a predetermined conductivity type. Chemical vapor deposition (CVD) or a similar technique is usually used to deposit the insulator, which typically comprises planarized silicon dioxide; a glass material (e.g., re-flowed phosphosilicate glass); a composite of silicon dioxide and silicon nitride; or a polymer like polyimide. Insulating layer 11 is formed over a previously-defined general conductor level 12. The conductor level may be a metallization layer, e.g., a portion of a wiring pattern which interconnects various integrated circuits. Alternatively, the conductor level may represent any type of active device, e.g., the source or drain region of a transistor. Enhanced connection of general conductor level 12 to other active devices or to other levels of metallization in a multi-layer structure is one of the objectives of this invention.

Potential etch stop layers 14 and 16 are optional elements of the present invention. In some embodiments, the etch stops are used to control etching depth, and thereby control the dimensions of the studs and interconnection lines, as described below. The etch stops may be deposited during the CVD process, and their composition is determined by the composition of the surrounding insulating layers. For example, when the insulator is silicon dioxide or glass, the etch stops are usually formed of a dissimilar type of oxide, e.g., aluminum oxide. For an insulating layer 11 having a thickness in the range of about 1.5 microns to about 2.0 microns, each etch stop layer usually has a thickness in the range of about 1000 Angstroms to about 1500 Angstroms.

The first mask 18 is applied over the surface of insulating layer 11, followed by imaging and etching according to well-known procedures. These procedures are described, for example, in *Introduction to Microlithography*, edited by L. Thompson et al, ACS Symp. Series 219, Amer. Chem. Soc., 1983, the contents of which are incorporated herein by reference. First mask 18, which can itself be an etch stop layer, is utilized to define contact "opening" or via 20, the extension of which will eventually accommodate a stud-down. (Those skilled in the art understand that the devices exemplified in these simplified figures would typically include multiple vias throughout their 3-dimensional structure, as depicted in some of the above-referenced patents.)

The dimensions of the contact via depend on various factors, such as the design of the metallization pattern for the structure, as well as the overall dimensions of the structure. Usually, the contact via has a depth in the range of about 1 micron to about 1.2 microns, and a width of about 1.5 microns to about 0.5 micron. In forming the contact via, etching is usually carried out to a desired depth, or to potential etch-stop 14.

In some embodiments of this invention, the first mask is also utilized to pattern and etch an endpoint detection area or "trench", shown as element 24 in FIG. 1. The endpoint detection area is a trough having a depth approximately equal to that of contact via 20, and a width greater than that of the contact opening. The width will usually be a value which is no greater than about 100 times larger than the minimum image which is definable by available photolithographic techniques. The endpoint detection area will eventually be used to control the height of the stud-up, as well as the width of the interconnection line, as described below. It does not have to be formed during formation of the contact opening, but is advantageously done so at that time because of processing efficiency.

Following formation of contact opening 20 and the optional endpoint detection area 24, a second mask 26 is deposited. As shown in FIG. 1, this mask usually overlaps at least a portion of first mask 18. The exact amount of overlap between the masks is determined in part by the desired dimensions of the studs and the interconnection line.

Mask 26 is imaged and etched (by techniques exemplified previously) to define interconnection line via 22, which will eventually accommodate an interconnection line. As is apparent from FIG. 1, this step involves the etching of selected areas of the insulating layer surface, along with selected areas of first mask 18. FIG. 1 also shows that the area of the interconnection line via 22 includes the cross-sectional width of contact via 20.

Mask 26 also serves to protect the optional endpoint detection area 24 from degradation due to additional processing steps. Removal of the mask later on in the process will permit use of the detection area to precisely control dimensions of the stud-up and interconnection line, as explained further on.

Figure 2:
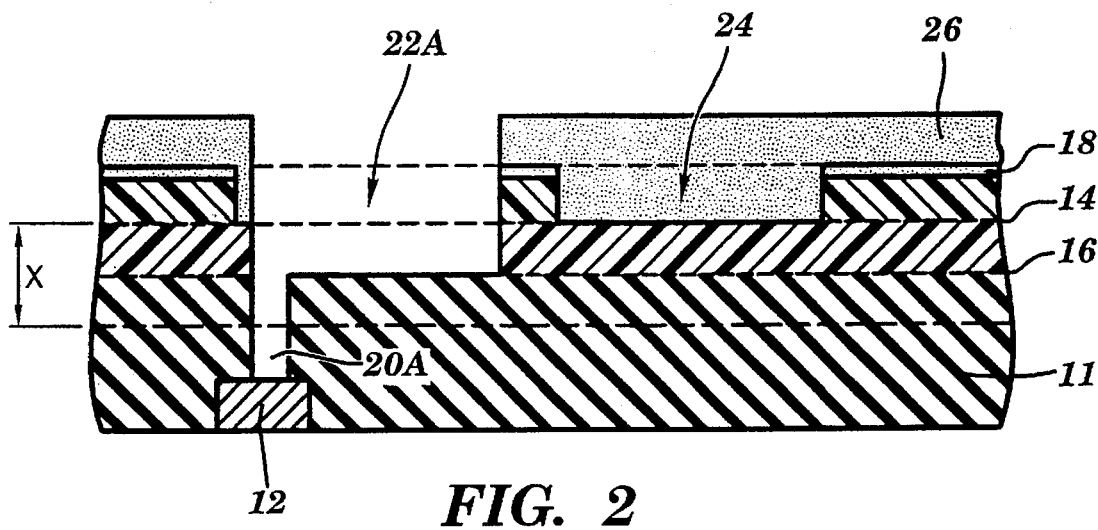
FIG. 2 is a cross-sectional view of further manufacturing stages relative to the structure of FIG. 1, including downward extension of the line and contact openings.

First mask 18 is then patterned and etched with second mask 26 to extend contact via 20 to a pre-selected depth, indicated by "X" in FIG. 2. The pre-selected depth is determined in part by the amount of additional etching that will subsequently be required to allow the contact hole to reach a desired lower level, e.g., general conductor level 12. The contact via depth reached in this step is thus usually a distance below that of potential etch stop 16, but above general conductor level 12.

The surface of insulating layer 11 is then etched through first mask 18 and second mask 26. This etching step extends the contact via to general conductor level 12, as shown in FIG. 2. The extended contact via is referred to as element 20A in the figure. At the same time, the depth of the interconnection line via is increased to a pre-selected level above the general conductor level, forming extended line via 22A. The exact depth of the extended line via will of course depend on the desired position for the line itself. In one embodiment, the etching can be terminated at potential etch stop 16, which was previously deposited at a selected level during formation of the insulator region.

Since second mask 26 at this point has performed its function relative to formation of the contact via and interconnection line via, it can now be removed.

Following removal of mask 26, metal is deposited to simultaneously fill the contact via and the interconnection line via. The filling of the contact via results in the formation of stud-down 36. The metal will also fill endpoint detection area 24, if present. Metallization techniques are well-known in the art and described, for example, in *VLSI Technology*, 2nd-Edition, S. M. Sze 1988 McGraw-Hill Publishing Company. Chapter 9 of this reference relates specifically to this topic, but the entire content of the Sze text is generally relevant, and is therefore incorporated herein by reference.

The reference also discusses suitable metals for various conductive features within a semiconductor structure. Illustrative metals and alloys are aluminum, copper, nickel, molybdenum, tungsten, platinum, tantalum disilicide, titanium disilicide, as well as other alloys of these materials. Aluminum; aluminum alloys such as aluminum-silicon; copper; and tungsten are often the materials of choice for interconnection metallization.

The metals may be deposited by known techniques, such as chemical vapor deposition (CVD) or low-pressure chemical vapor deposition (LPCVD). The selection of particular equipment and process parameters for CVD and LPCVD can be determined by one skilled in semiconductor processing, without undue effort. Deposition of the metal (usually in blanket-fashion over the entire surface of the semiconductor structure) also fills extended contact via 20A and extended line opening 22A.

The metallized surface of the semiconductor structure is then usually planarized. Various methods of planarization are known in the art. One especially suitable technique is chemical-mechanical polishing (CMP), which is described in the following U.S. patents, all of which are incorporated herein by reference: U.S. Pat. No. 5,292,689; U.S. Pat. No. 5,234,868; U.S. Pat. No. 4,944,836; and U.S. Pat. No. 4,910,155. In brief, CMP involves the use of a polishing pad and slurry to grind down the surface. The CMP slurry usually contains small particles of a controlled size, e.g., silicon dioxide particles, dispersed in solution. The liquid portion of the solution acts as both a lubricant and a travel medium for the polishing particles.

Figure 3:
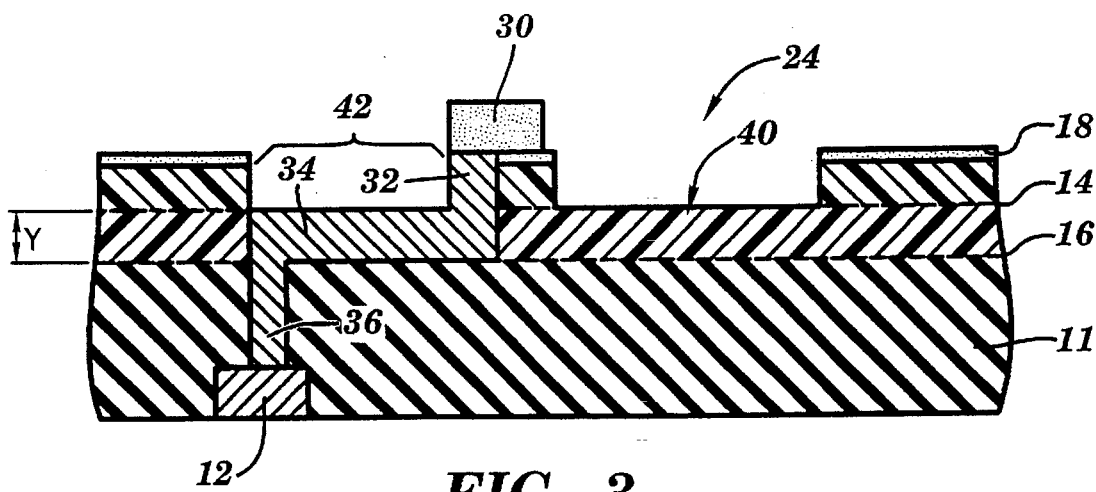
FIG. 3 is a cross-sectional view of the structure of FIG. 2, showing completion of the studs and an interconnection line.

After planarization is complete, a third mask 30 is applied on a pre-selected area of the semiconductor surface, to define a stud-up, as depicted in FIG. 3. The position of mask 30 will of course depend on the desired position of the stud-up.

Next, the exposed metal is etched by suitable techniques to form the stud-up 32, which is the uppermost vertical portion of metal remaining after removal of the surrounding, unwanted metal. Many types of etching are known in the art and described, for example, in the Sze text mentioned above. A preferred method of etching metal for most embodiments of this invention is reactive ion etching (RIE), sometimes referred to as reactive sputter etching (RSE). Details regarding RIE are also generally well-known in the art.

The amount of etching required depends on both the desired height of the stud-up, as well as the desired thickness of interconnection line 34. Both of these dimensions are determined by the same etching step.

Etching of the metal can be controlled somewhat by several techniques, e.g., by control of etching time. However, in preferred embodiments, the precise degree of etching at this stage is more readily achieved by the use of the endpoint detection trench 24, depicted in FIG. 3. This trench (optionally formed earlier in the process, as described above), is initially open at the upper surface of insulating layer 11 and first mask 18. Its depth was predetermined to be the eventual height of stud-up 32, as well as the thickness of the interconnection line 34. The latter dimension is represented as dimension "Y" in FIG. 3. Trench 24 was then filled with metal and planarized during the metal deposition step described earlier.

Thus, etching of the semiconductor surface can be carried out until the endpoint detection trench is "cleaned" of metal, i.e., until bottom surface 40 of the trench is reached. The precise endpoint is easy to determine, by way of a reflecting light (e.g., a laser beam), since passage of the beam from metal to an insulating material instantaneously causes a large change in the reflective signal. This contrasts with the difficulty of determining how far to etch into the desired depth of a metal layer itself, i.e., into the metal mass which would eventually constitute line 34.

With reference to FIG. 3, etching to the point of complete removal of metal from endpoint detection trench 24 simultaneously results in the desired removal of metal from trench region 42. Thus, stud-up 32 is formed of a specific height, while metal interconnection line 34 is formed with a determined, final thickness. At this point, mask 30 is no longer needed and can be removed.

Another insulator layer (not shown) is then usually applied over the surface of the semiconductor structure and planarized back to first mask 18. Examples of suitable insulator layers are silicon oxide and glass materials like phosphosilicate or borophosphosilicate. As described previously, these materials can be deposited by CVD or LPCVD. Planarization can be carried out by the usual methods, e.g., CMP.

Thus, it should be apparent that another aspect of the present invention is directed to a semiconductor structure which comprises:
  (i) an insulator region disposed over a substrate;
  (ii) a general conductor level within the interior of the insulator region;
  (iii) at least one stud-down, having a lower end connected to the general conductor level, and having an upper end connected to an interconnection line situated within the interior of the insulator region; and
  (iv) at least one stud-up having a lower end connected to the interconnection line, and having an upper end which terminates at or near the upper surface of the insulator region.

The stud-up, stud-down, and interconnection line are self-aligned and formed from a single layer of metal. Those of skill in the art understand that this aspect of the present invention is not limited to just one layer of metal which includes a stud-up, stud-down, and interconnection line. Multiple stud-ups and stud-downs could be formed across the cross-section of a semiconductor structure by the same process, with each stud-up and stud-down connected to an interconnection line. Moreover, more than one stud-up and/or stud-down could be attached to a single interconnection line.

Furthermore, the semiconductor structure could include various additional levels of electrical devices, studs, and metallization patterns above the upper insulating layer covering mask 18. Each of these additional levels could include at least one stud-up\interconnection line\stud down arrangement as described earlier.

The semiconductor devices of this invention are characterized by very low pitch, thereby permitting a high density of electrical features. Furthermore, the studs and interconnection lines have very precise dimensions. The devices are also characterized by a very low number of defects occurring from electrical shorts and the like.

In addition to improvements occurring from use of the endpoint detection trench, the process set forth above exhibits several other notable advantages. For example, the stud-ups are embedded into the vias or "troughs" within the insulating layer, thereby making them flush with the semiconductor surface. This is in contrast to the process taught in the above-mentioned U.S. Pat. No. 4,962,058 of J. Cronin et al, wherein the stud-ups are formed on top of the semiconductor surface. Although U.S. Pat. No. 4,962,058 also includes stud-ups, interconnection lines, and stud-downs all formed of a single layer of metal, planarization of the structures therein can sometimes be much more difficult than in the present invention.

Furthermore, the present invention requires much less metal to be etched than in the Cronin et al patent, thereby minimizing the occurrence of "etch residuals" and metal "stringers".

This process also permits the convenient formation of both thick and thin wiring structures. That is, the third mask can also be used to form regions wherein at least a portion of the metal wiring in the troughs or vias can have a thickness equal to the total thickness of the interconnection line and the stud-up. Such a structure is sometimes advantageous, e.g., where it is desirable to have a thicker metal line (for low resistance) and a thinner metal line (for lower capacitance) on the same plane or wiring level.

As described previously, some embodiments of this invention are directed to a semiconductor structure which includes at least one stud-up and at least one interconnection line connected thereto, at the lower end of the stud-up. No stud-down is necessary. The stud-up and the interconnection line are self-aligned, and are formed from a single layer of metal, and as in the other embodiments, they are embedded in the troughs within the insulating region. The steps for forming such a structure have been described previously. As also described previously, this structure could optionally include additional levels of electrical devices, studs, and metallization patterns.

It should be clear from the foregoing that the structures described herein can also include the endpoint detection area or trench described above. In fact, still another embodiment of the present invention relates to a general method of precisely controlling the etching depth of a via within a metal layer disposed over an insulator region, comprising the steps of:
  a) forming an endpoint detection trench within the insulator region, at a position parallel to and planar with the desired starting point for the metal layer via, said endpoint trench having a depth equal to the desired etching depth for the metal layer via, and being filled with the metal forming the metal layer; and
  b) directionally etching all of the exposed metal on the surface of the insulator region, said etching being carried out until the endpoint detection trench is cleared or "cleaned" of metal, so that the desired via has been formed by the simultaneous removal of the necessary amount of metal from the metal layer. Usually, the metal which initially fills the detection trench is deposited simultaneously with the metal layer in which the via is being formed. This technique is very useful in the formation of semiconductor structures, as described above.

While some of the preferred embodiments of this invention have been described for the purpose of disclosure, numerous modifications in the details of construction and processing will be readily apparent to those skilled in the art. As an example, it should be understood that the exemplary dimensions set forth above are provided with the understanding that continually improving techniques like photolithography will permit the same inventive concepts to be applied on a much smaller scale in the future. Thus modifications, such as those relating to size reduction, are encompassed within the spirit of the present invention and the scope of the appended claims.

All of the patents, publications, and texts mentioned above are incorporated herein by reference.

I claim:

1. An improved method for preparing a semiconductor structure which includes at least one stud-up and at least one interconnection line connected to the stud-up, wherein the stud-up and the interconnection line are self-aligned, and are formed from a single layer of metal; said method comprising the following steps:
   a) providing an insulator region on a semiconductor substrate;
   b) patterning and etching the insulator region with a mask to define at least one opening having a desired depth;
   c) depositing metal to overfill the opening, thereby forming a metallized surface over the insulator region and forming the interconnection line;
   d) planarizing the metallized surface over the insulator region back to the mask deposited in step b); and
   e) patterning and then forming a stud-up of desired dimensions within the metal-filled opening, the lower end of said stud-up being connected to the interconnection line, and the upper end of said stud-up terminating at or near the upper surface of the insulator region.

2. The method of claim 1, wherein the metal is deposited in step (c) by either CVD or low-pressure CVD.

3. The method of claim 1, wherein the stud-up is patterned and formed by the use of a mask applied over a portion of the surface of the semiconductor, said surface being at least partially covered with metal during the deposition of step (c).

4. The method of claim 3, wherein reactive ion etching is used to remove unwanted portions of metal during formation of the stud-up.

5. The method of claim 1, wherein the insulator region is formed of a material selected from the group consisting of silicon dioxide, phosphosilicate glass, a composite of silicon dioxide and silicon nitride, and polyimide.

6. The method of claim 1, wherein the interconnection line comprises a material selected from the group consisting of aluminum, tungsten, copper, aluminum-silicon, and alloys comprising any of the foregoing.

7. The method of claim 1, wherein formation of the stud-up in step (e) is carried out by removing portions of the metal deposited in step (c).

8. The method of claim 7, wherein the height of the stud-up is determined by the use of an endpoint detection trench, open at the upper surface of the insulator region, and having a depth equal to the desired height of the stud-up, said detection trench being filled with metal during step (c), wherein detection of the removal of all of the metal from the detection trench signals the endpoint for the metal removal step being carried out to form the stud-up.

9. The method of claim 8, wherein the endpoint detection trench is formed by etching during etching step (b).

10. An improved method for preparing a semiconductor structure which includes at least one stud-up, at least one stud-down, and at least one interconnection line which connects a stud-up to a stud-down, wherein the stud-up, stud-down, and interconnection line are self-aligned and formed from a single layer of metal; said method comprising the following steps:
   a) providing an insulator region on a semiconductor substrate, said region containing a general conductor level therein;
   b) patterning and etching the insulator region with a first mask, to define at least one contact via having a desired depth;
   c) patterning and etching the insulator region and the exposed surface of the first mask with a second mask, to define at least one interconnection line via which includes the cross-sectional width of the contact via;
   d) patterning and etching the first mask with the second mask to extend the contact via to a desired depth;
   e) etching the surface of the insulator region through the first and second masks, to extend the contact via to the general conductor level, while at the same time increasing the depth of the interconnection line via to a desired level above the general conductor level; followed by removal of the second mask;
   f) depositing metal to simultaneously fill the contact via and the interconnection line via; thereby forming the stud-down and the interconnection line, respectively; and
   g) patterning and then forming a stud-up of desired dimensions within the metal-filled contact area, the lower end of said stud-up being connected to the interconnection line, and the upper end of said stud-up terminating at or near the upper surface of the insulator region.

11. The method of claim 10, wherein the first mask is an etch stop layer.

12. The method of claim 10, wherein the desired level in step (e) is represented by a second etch stop layer.

13. The method of claim 10, wherein the surface of the insulator region is planarized after step (f).

14. The method of claim 10, wherein the stud-up is patterned and formed by the use of a third mask applied over a portion of the insulator region.

15. The method of claim 10, wherein reactive ion etching is used to remove unwanted portions of metal during formation of the stud-up.

* * * * *